United States Patent [19]
Suh

[11] Patent Number: 5,814,851
[45] Date of Patent: *Sep. 29, 1998

[54] SEMICONDUCTOR MEMORY DEVICE USING A PLURALITY OF INTERNAL VOLTAGES

[75] Inventor: Jung Won Suh, Ichon, Rep. of Korea

[73] Assignee: Hyundai Electronics Industries Co., Ltd., Ichon, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 698,937

[22] Filed: Aug. 16, 1996

[30] Foreign Application Priority Data

Aug. 18, 1995 [KR] Rep. of Korea ............... 1995-25433

[51] Int. Cl.⁶ ..................... H01C 27/108; G11C 11/24
[52] U.S. Cl. .................. 257/296; 257/298; 257/299; 257/300; 365/149; 365/189.01; 365/226
[58] Field of Search .................... 257/296, 298, 257/299, 300, 906, 908; 365/149, 189.01, 226

[56] References Cited

U.S. PATENT DOCUMENTS

| | | | |
|---|---|---|---|
| 5,119,163 | 6/1992 | Ishihara et al. | 365/96 |
| 5,150,325 | 9/1992 | Yanagisawa et al. | 365/177 |
| 5,229,154 | 7/1993 | Oowaki et al. | 365/149 |
| 5,305,270 | 4/1994 | Kim | 365/149 |
| 5,337,270 | 8/1994 | Kawata et al. | 365/149 |
| 5,376,839 | 12/1994 | Horiguchi et al. | 327/541 |
| 5,555,519 | 9/1996 | Takashima et al. | 257/296 |
| 5,579,524 | 11/1996 | Kikinis | 365/226 |

*Primary Examiner*—Carl W. Whitehead, Jr.
*Attorney, Agent, or Firm*—Thelen Reid & Priest LLP

[57] ABSTRACT

A semiconductor memory device has memory cells including a capacitor for storing data, and a transistor for inputting a ground voltage at its substrate and for selectively connecting the capacitor to a bit line. The device also has sense amplifiers that sense and amplify data that is transferred from the memory cells to the bit line. The device further has a first internal voltage supply circuit that generates a first internal voltage and supplies it to the sense amplifiers. The device also has a PMOS transistor for switching the first internal voltage from the first internal voltage supply circuit to the sense amplifiers, a second internal voltage supply circuit that generates a second internal voltage and supplies it to the sense amplifiers, and an NMOS transistor for switching the second internal voltage from the second internal voltage supply circuit to the sense amplifiers. Power lines to the sense amplifiers are separated from a power fine to the peripheral circuit, so that the device reduces noise effects on the power line to the peripheral circuit.

7 Claims, 7 Drawing Sheets

SEMICONDUCTOR MEMORY DEVICE USING A PLURALITY OF INTERNAL VOLTAGES

BACKGROUND OF THE INVENTION

1. Field of the Invention

The present invention relates in general to a semiconductor memory device using a plurality of internal voltages, and more particularly to a semiconductor memory device such as a dynamic random access memory for separating a voltage used in a sense amplifier array from a voltage used in the peripheral circuit.

2. Description of the Prior Art

Recently, as semiconductor memory devices are highly integrated, scaled down transistors are used and the number of memory cells accessed at a time is increased. As a result, various problems are caused, in particular, in the case where a deep submicron transistor is used in a memory cell, subthreshold leakage current of the deep submicron transistor is increased due to the scaling of a threshold voltage $V_T$ thereof, thereby causing a loss in charge stored in a cell capacitor to be increased under the condition that a word line is turned off. The increased charge loss results in a deterioration in a refresh characteristic.

In a conventional semiconductor memory device such as a dynamic random access memory (referred to hereinafter as DRAM), in order to solve the above problem, a negative p-well bias voltage is applied to a substrate to raise a threshold voltage $V_T$ of a cell transistor. The raised threshold voltage $V_T$ reduces subthreshold leakage current of the cell transistor. However, in this case, a reverse electric field is increased at an n+p junction between a charge storage plate of a cell capacitor Cs and the substrate, resulting in the deterioration in the refresh characteristic. Such a problem with the conventional DRAM will hereinafter be described in detail with reference to FIGS. 1A and 1B.

Figure 1A:
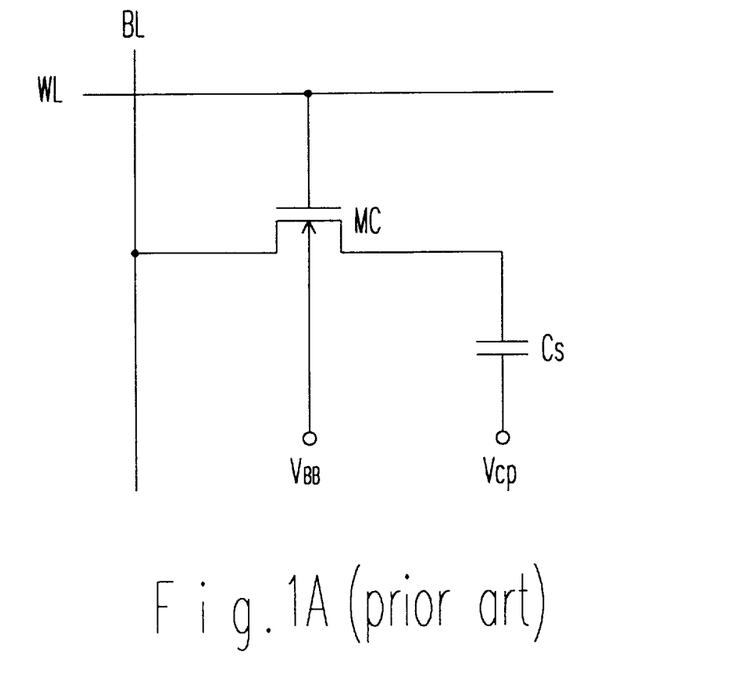
FIG. 1A is a circuit diagram illustrating the construction of a memory cell in a conventional DRAM.
Figure 1B:
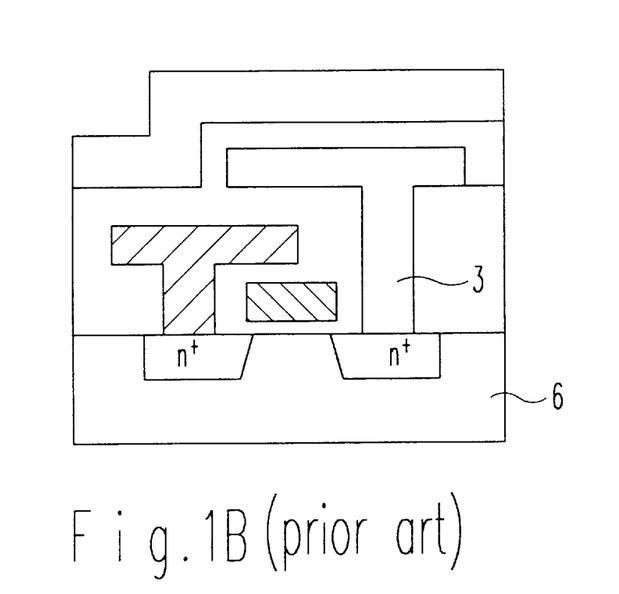
FIG. 1B is a sectional view of the memory cell in FIG. 1A.

FIG. 1A is a circuit diagram illustrating the construction of a memory cell in a conventional DRAM. A threshold voltage $V_T$ of a cell transistor Mc is raised due to a body effect by applying a negative p-well bias voltage $V_{BB}$ to a substrate of the cell transistor Mc, thereby reducing subthreahold leakage current of the cell transistor Mc. However, as seen from FIG. 1B which is a sectional view of the memory cell in FIG. 1A, if the negative p-well bias voltage $V_{BB}$ is applied to the substrate 6 of the cell transistor Mc, a reverse bias of the maximum "$|V_{BB}|$+high data voltage" is applied to an n+p junction between a charge storage plate 3 of a cell capacitor Cs and the substrate 6, thereby causing junction leakage current to be increased as an absolute value of the negative p-well bias voltage $V_{BB}$ is increased. Generally, data hold time of the DRAM cell is determined according to the level of the junction leakage current. As a result, it is preferred to reduce a reverse electric field at the n+p junction to enhance the refresh characteristic.

Further, in the conventional semiconductor memory device, the number of sense amplifiers is increased in proportion to the number of memory cells, resulting in an increase in noise induced on a power line. In other words, a large amount of current instantaneously flows in a sense amplification operation because sense amplifiers in a sense amplifier array connected to memory cells are simultaneously driven. Such a large instantaneous current amount results in the generation of noise on the power line. The generated noise exerts a bad affect on the peripheral circuit.

SUMMARY OF THE INVENTION

Therefore, the present invention has been made in view of the above problems, and it is an object of the present invention to provide a semiconductor memory device which is capable of enhancing a cell refresh characteristic and reducing noise on a power line.

In accordance with the present invention, the above and other objects can be accomplished by a provision of a semiconductor memory device comprising a plurality of memory cells, each of the plurality of memory cells including a capacitor for storing data therein and a transistor for inputting a ground voltage at its bulk and selectively connecting the cell capacitor to a bit line; a plurality of sense amplifiers for sensing/amplifying data which are transferred from the memory cells to the bit line; first internal voltage supply means for generating a first internal voltage and supplying the generated first internal voltage to the sense amplifiers to drive them: first switching means for switching the first internal voltage from the first internal voltage supply means to the sense amplifiers; second internal voltage supply means for generating a second internal voltage and supplying the generated second internal voltage to the sense amplifiers to drive them, and second switching means for switching the second internal voltage from the second internal voltage supply means to the sense amplifiers.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 2:
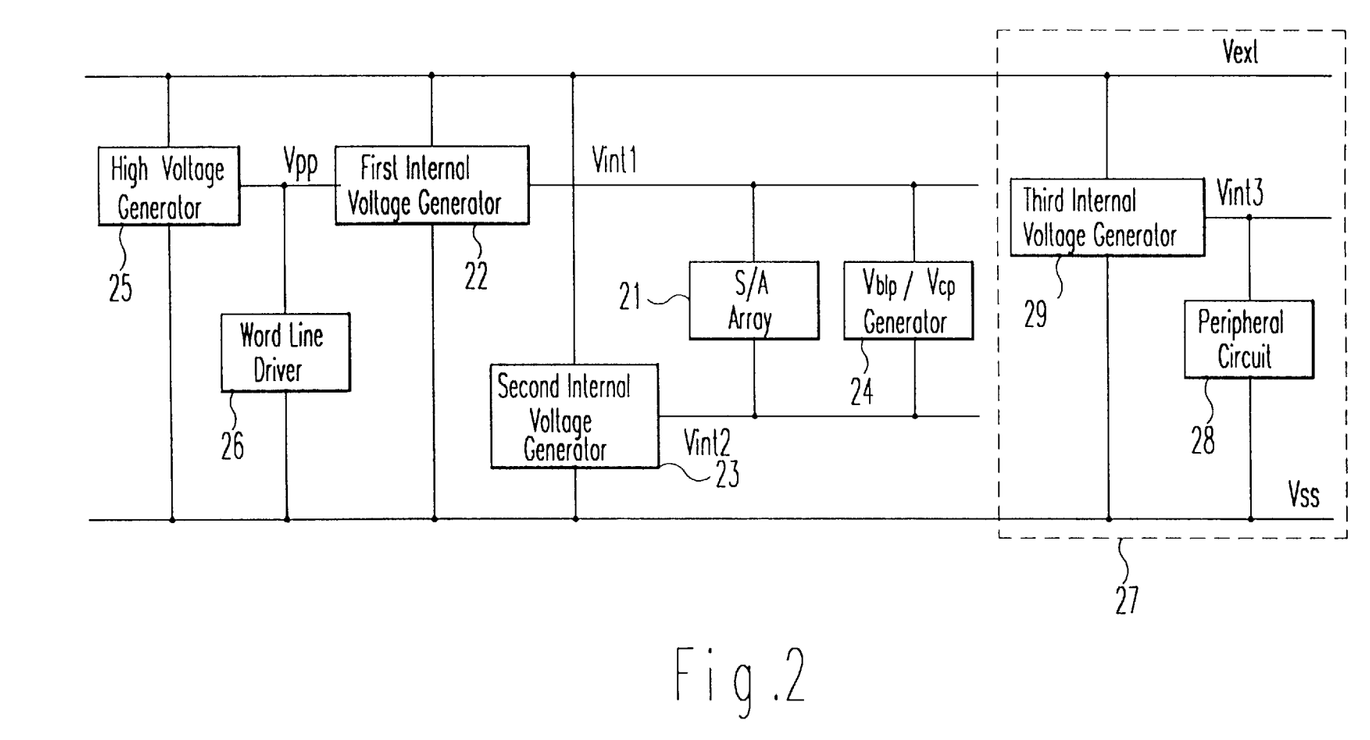
FIG. 2 is a block diagram illustrating the construction of a semiconductor memory device in accordance with the present invention.

Referring to FIG. 2, there is shown in block form the construction of a semiconductor memory device using a plurality of internal voltages in accordance with the present invention. As shown in this drawing, the semiconductor memory device comprises a high voltage generator 25 and first to third internal voltage generators 22, 23 and 29 connected between an external supply voltage line Vext and a ground voltage line Vss. A word line driver 26 is connected between an output line Vpp of the high voltage generator 25 and the ground voltage line Vss. A sense amplifier array 21 and a bit line precharge voltage/capacitor plate voltage generator 24 are connected in parallel between output lines Vint1 and Vint2 of the first and second internal voltage generators 22 and 23. The peripheral circuit 28 is connected between an output line Vint3 of the third internal voltage generator 29 and the ground voltage line Vss.

In FIG. 2, the sense amplifier array 21 and the bit line precharge voltage/capacitor plate voltage generator 24 are driven in response to first and second internal voltages Vint1 and Vint2 from the first and second internal voltage generators 22 and 23. The peripheral circuit 28 is driven in response to a third internal voltage Vint3 from the third internal voltage generator 29 and a ground voltage Vss from the ground voltage line Vss. Although the three internal voltages are used for illustrative purposes, an external supply voltage Vext from the external supply voltage line Vext may be used instead of the first internal voltage Vint1 from the first internal voltage generator 22 or the first and third internal voltages Vint1 and Vint3 from the first and third internal voltage generators 22 and 29 may be the same, Noticeably, a large amount of current instantaneously flows when the sense amplifier array 21 performs a sense amplification operation. However, the voltage supply manner am mentioned above enables the sense amplifier array to use a separate power line. The use of the separate power line reduces a noise effect on the power line to the peripheral circuit. The levels of the above-mentioned voltages can be expressed as follows:

$$Vss \leq Vint2 \leq Vint1 \leq Vext$$

Figure 3A:
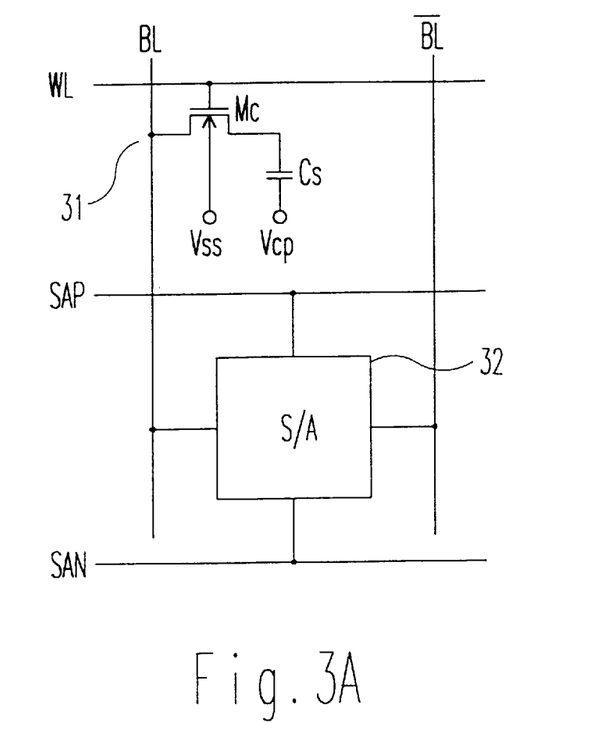
FIG. 3A is a circuit diagram illustrating a connection state between a memory cell and a sense amplifier In accordance with the present invention.

FIG. 3A is a circuit diagram illustrating a connection state between a memory cell 31 and a sense amplifier 32 in accordance with the present invention. The memory cell 31 includes a capacitor Cs for storing data therein, and a transistor Mc for inputting the ground voltage Vss at its bulk and selectively connecting the cell capacitor Cs to a bit line.

In FIG. 3A, the substrate voltage of the cell transistor Mc is not a negative well voltage $V_{BB}$ used in a conventional DRAM but the ground voltage Vss. As a result, a reverse bias to an n+p junction between a charge storage plate of the cell capacitor Cs and the substrate is reduced nearly by an absolute value of the negative well voltage Vss, resulting in a reduction in junction leakage current, Also, because a word line WL has the ground voltage level Vss in a standby mode, a negative bias of −Vint2 is applied between the gate and source of the cell transistor Mc even in the worst case. As a result, even in the case where the substrate voltage is not the negative well voltage level $V_{BB}$ but the ground voltage level Vss, subthreshold leakage currant of the cell transistor Mc can sufficiently be reduced.

Figure 3B:
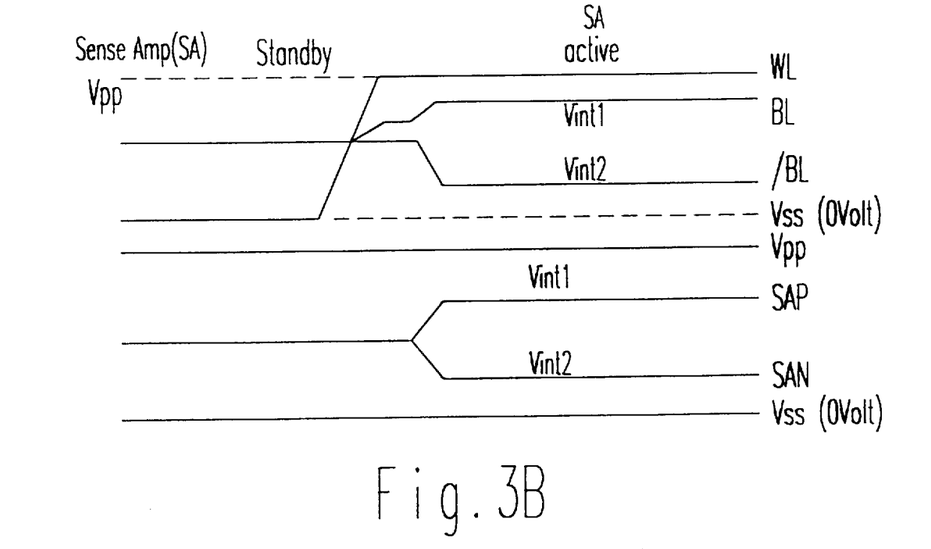
FIG. 3B is a timing diagram of signals in FIG. 3A.

FIG. 3B is a timing diagram of signals at common source nodes SAP and SAN of PMOS transistors and NMOS transistors in the sense amplifier array in FIG. 3A. As shown in this drawing, data from the memory cell is sufficiently transferred to the bit line BL as the voltage level of the word line WL is made active from the ground voltage level Vss to a high voltage level Vpp. Thereafter, the common source nodes SAP and SAN go from a bit line precharge voltage level $V_{BLP}$ to the first and second internal voltage levels Vint1 and Vint2, respectively, to establish the sense amplification operation. As a result, high data from the memory cell has the first internal voltage level Vint1 and low data therefrom has the second internal voltage level Vint2.

Figure 4:
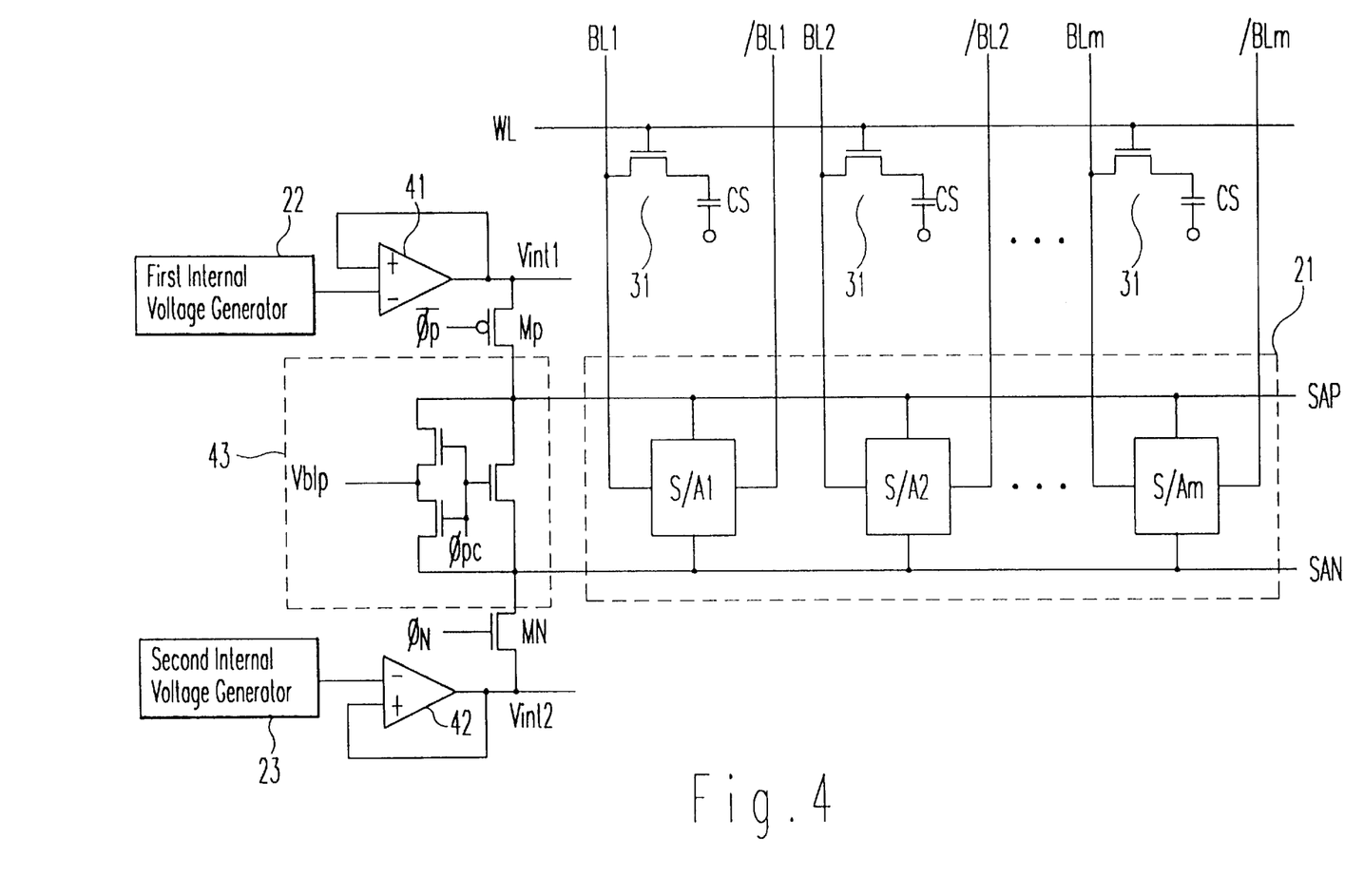
FIG. 4 is a circuit diagram illustrating the construction of the semiconductor memory device in accordance with the present invention.

FIG. 4 is a circuit diagram illustrating the construction of the semiconductor memory device in accordance with the present invention. The sense amplifier array 21 is adapted to sense/amplify data which is transferred from the memory cell 31 to the bit line. The first internal voltage generator 22 is adapted to generate the first internal voltage Vint1 of high level to drive the sense amplifier array 21. A first internal voltage driver 41 is adapted to apply the first internal voltage Vint1 from the first internal voltage generator 22 to the sense amplifier array 21. A switching PMOS transistor $M_F$ is adapted to switch the first internal voltage Vint1 applied by the first internal voltage driver 41 to the sense amplifier array 21. The second internal voltage generator 23 is adapted to generate the second internal voltage Vint2 of low level to drive the sense amplifier array 21. A second internal voltage driver 42 is adapted to apply the second internal voltage Vint2 from the second internal voltage generator 23 to the sense amplifier array 21. A switching NMOS transistor $M_N$ is adapted to switch the second internal voltage Vint2 applied by the second internal voltage driver 42 to the sense amplifier array 21. A precharge circuit 43 is connected between the common source nodes SAP and SAN of the PMOS transistors and NMOS transistors in the sense amplifier array 21.

In FIG. 4, m sense amplifiers SAj (where, $1 \leq j \leq m$) in the sense amplifier array 21 are adapted to sense/amplify cell data signals transferred to bit lines BLi (where, $1 \leq i \leq m$) as the voltage level of the word line WL is made active from the ground voltage level Vss to the high voltage level Vpp.

The common source nodes SAP and SAN are precharged with the bit line precharge voltage level $V_{BLP}$ under the condition that a precharge control signal $\phi_{PC}$ is made active. When a first control signal $\phi_P$ is made active after the precharge control signal $\phi_{PC}$ is made active, the switching PMOS transistor $M_P$ is turned on, thereby causing the common source node SAP to go from the bit line precharge voltage level $V_{BLP}$ to the first internal voltage level Vint1. If a second control signal $\phi_N$ is made active after the precharge control signal $\phi_{PC}$ is made active, the switching NMOS transistor $M_N$ is turned on, thereby causing the common source node SAN to go from the bit line precharge voltage level $V_{BLP}$ to the second internal voltage level Vint2. As a result, the sense amplifier array 21 is driven.

At this time, the first and second internal voltage drivers 41 and 42 are driven in such a manner that the first and second internal voltage levels Vint1 and Vint2 from the first and second internal voltage generators 22 and 23 can be equal to a reference voltage level.

Figure 5A:
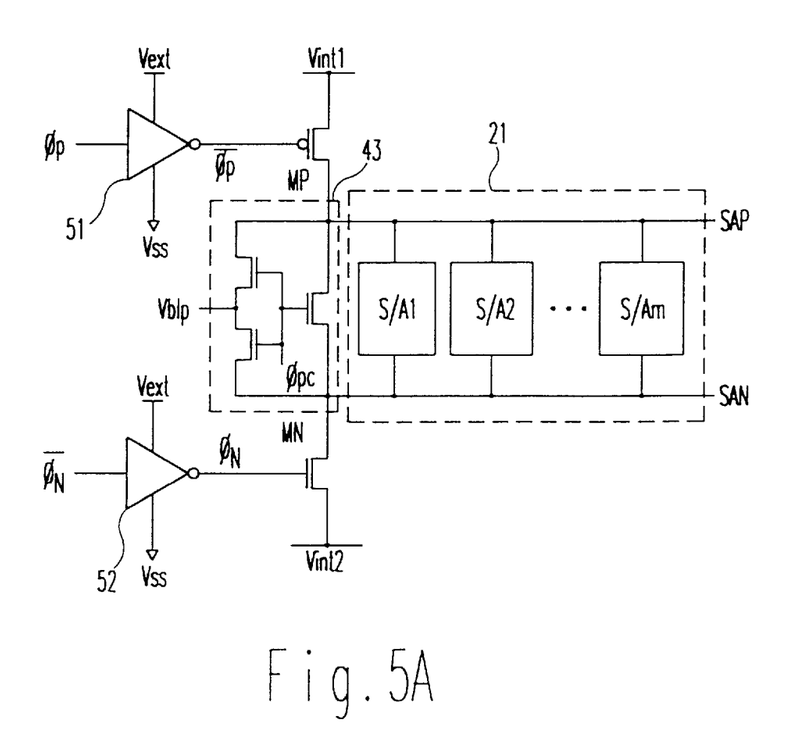
FIG. 5A is a circuit diagram illustrating the construction for controlling a switching PMOS transistor and a switching NMOS transistor in FIG. 4 in accordance with the present invention.

FIG. 5A is a circuit diagram illustrating the construction for controlling the switching PMOS transistor $M_P$ and the switching NMOS transistor $M_N$ in FIG. 4. The control construction of this drawing is an embodiment for reducing subthreshold current of the switching PMOS transistor $M_P$ and switching NMOS transistor $M_N$ acting as switching means for the sense amplifier array 21 in the standby mode. The construction of FIG. 5A is the same as that of FIG. 4, with the exception that first and second inverters 51 and 52 are connected respectively to the gates of the switching PMOS transistor $M_P$ and switching NMOS transistor $M_N$. The first and second inverters 51 and 52 are operated in response to the external supply voltage Vext of high level and the ground voltage Vss of low level. Also, the first inverter 51 receives an inverted one $/\phi_P$ of the first control signal $\phi_P$ and the second inverter 52 receives an inverted one $/\phi_N$ of the second control signal $\phi_N$. The first and second inverters 51 and 52 are adapted to fix high and low levels of the first and second control signals $\phi_P$ and $\phi_N$ to the external supply voltage level Vext and ground voltage level Vss, respectively. As a result, a positive voltage (Vext−Vint1>0V) is applied between the gate and source of the switching PMOS transistor $M_P$ and a negative voltage (Vss−Vint2<0V) is applied between the gate and source of the switching NMOS transistor $M_N$. Therefore, the subthreshold current of the switching PMOS transistor $M_P$ and switching NMOS transistor $M_N$ is significantly reduced.

In other words, the positive voltage (Vout−Vint1>0V) is applied between the gate and source of the switching PMOS transistor $M_P$ due to a difference between the first internal voltage Vint1 from the first internal voltage generator 22 and the output external supply voltage Vout from the first inverter 51. Also, the negative voltage (Vsu−Vint2<0V) is applied between the gate and source of the switching NMOS transistor $M_N$ due to a difference between the second internal voltage Vint2 from the second internal voltage generator 22 and the output ground voltage Vss from the second inverter 52. As a result, the subthreshold current of the switching PMOS transistor $M_P$ and switching NMOS transistor $M_N$ is significantly reduced.

Figure 5B:
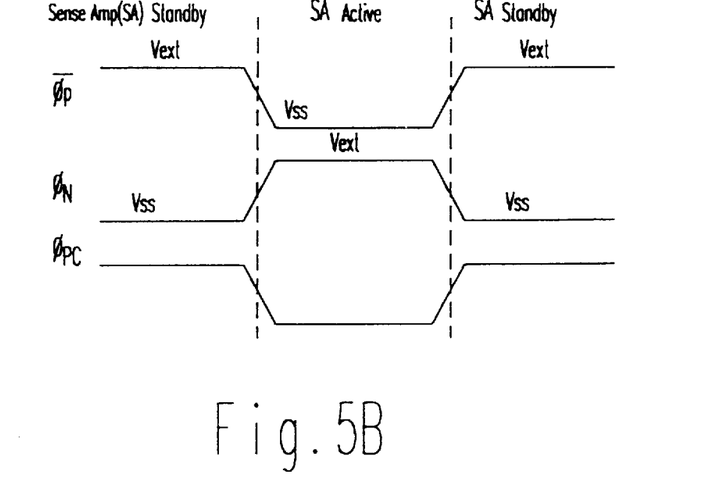
FIG. 5B is a timing diagram of control signals in FIG. 5A.

FIG. 5B is a timing diagram of the first and second control signals $\phi_P$ and $\phi_N$ and the precharge control signal $\phi_{PC}$ in FIG. 5A. In the standby mode, the first control signal $\phi_P$ and the precharge control signal $\phi_{PC}$ have their high voltage levels Vout and the second control signal $\phi_N$ has its low voltage level Vss. In the active mode, the first control signal $\phi_P$ and the precharge control signal $\phi_{PC}$ have their low voltage levels Vss and the second control signal $\phi_N$ has its high voltage level Vout.

Figure 6A:
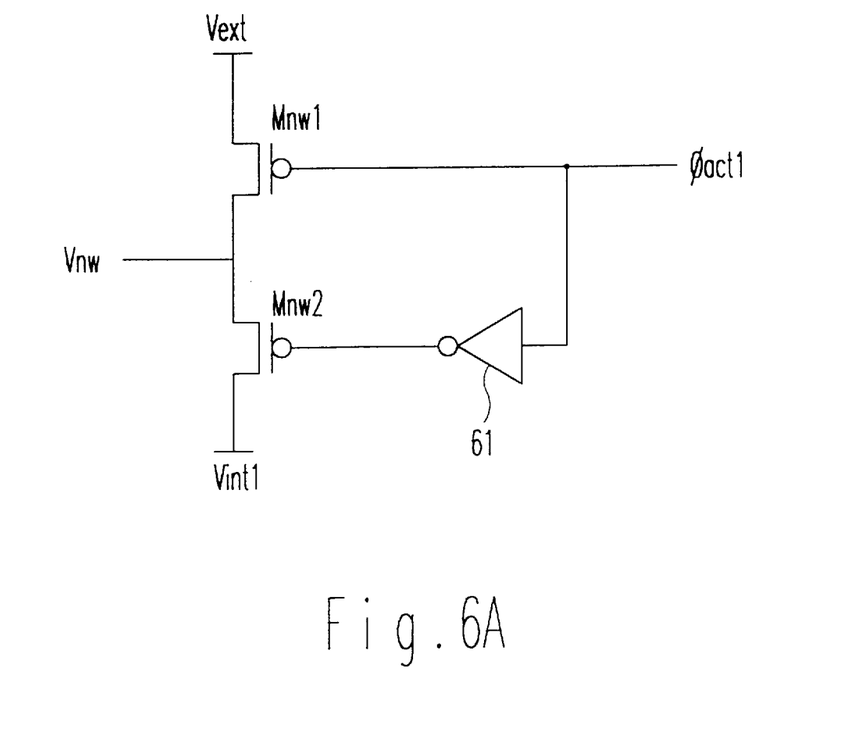
FIG. 6A is a circuit diagram of PMOS transistors for driving sense amplifiers in the semiconductor memory device in accordance with the present invention.
Figure 6B:
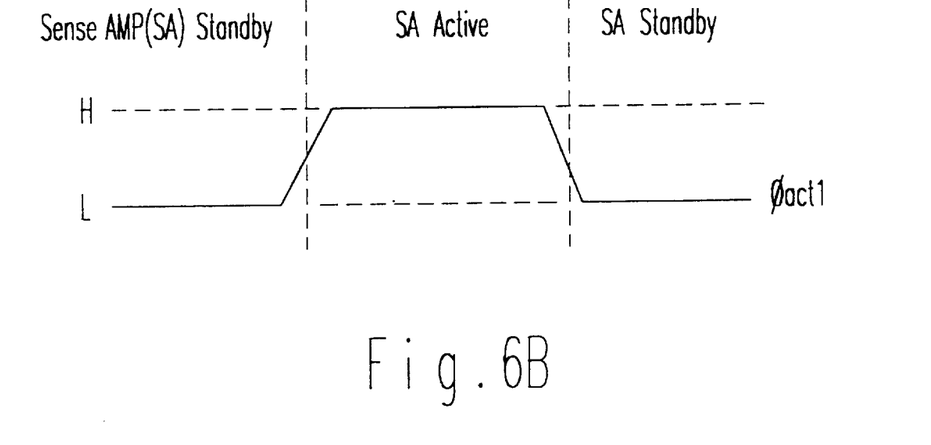
FIG. 6B is a timing diagram of a control signal in FIG. 6A.

FIG. 6A is a circuit diagram of PMOS transistors for driving the sense amplifiers in the semiconductor memory device in accordance with the present invention and FIG. 6B is a timing diagram of a third control signal $\phi_{act1}$ in FIG. 6A. As shown in FIG. 6B, the third control signal $\phi_{act1}$ is low ("0") in logic in the standby mode and high ("1") in logic in the active mode. In the standby mode, a first PMOS transistor $M_{NW1}$ is turned on in response to the third control signal $\phi_{act1}$ and a second PMOS transistor $M_{NW2}$ is turned off in response to an output signal from an inverter 61 which inverts the third control signal $\phi_{act1}$, thereby causing an n-well voltage $V_{NW}$ to PMOS transistors in the sense amplifiers to have the external supply voltage level Vext. As a result, a threshold voltage $V_T$ of the PMOS transistors in the sense amplifiers is raised due to the body effect, resulting in a reduction in the subthreshold current.

On the other hand, in the case where the present mode is changed from the standby mode to the active mode, the second PMOS transistor $M_{NW2}$ is turned on in response to the output signal from the inverter 61 and the first PMOS transistor $M_{NW1}$ is turned off in response to the third control signal $\phi_{act1}$. As the second PMOS transistor $M_{NW2}$ is turned on, an n-well bias node is connected to the first internal voltage generator 22. The first internal voltage Vint1 on the power line of the first internal voltage generator 22 is temporarily raised due to the charge sharing resulting from a voltage difference between an n-well capacitor and a capacitor of the first internal voltage generator 22. As a result, the PMOS transistors in the sense amplifiers are excessively driven in response to the raised first internal voltage Vint1. In other words, in the sense amplification operation, the first internal voltage Vint1 on the power line of the first internal voltage generator 22 is temporarily raised due to a positive charge stored in the n-well capacitor, thereby allowing the sense amplifiers to be operated at high speed. Further, the n-well voltage $V_{NW}$ becomes lower as compared with that in the standby mode, resulting in a reduction in the threshold voltage $V_T$ of the PMOS transistors in the sense amplifiers. Therefore, the entire circuit can be operated at high speed.

Figure 7A:
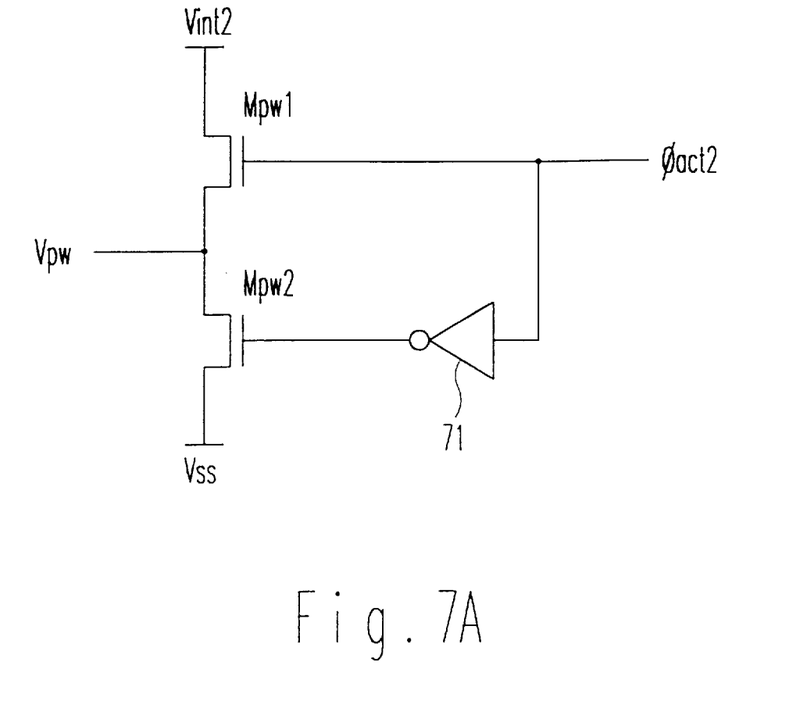
FIG. 7A is a circuit diagram of NMOS transistors for driving the sense amplifiers in the semiconductor memory device in accordance with the present invention.
Figure 7B:
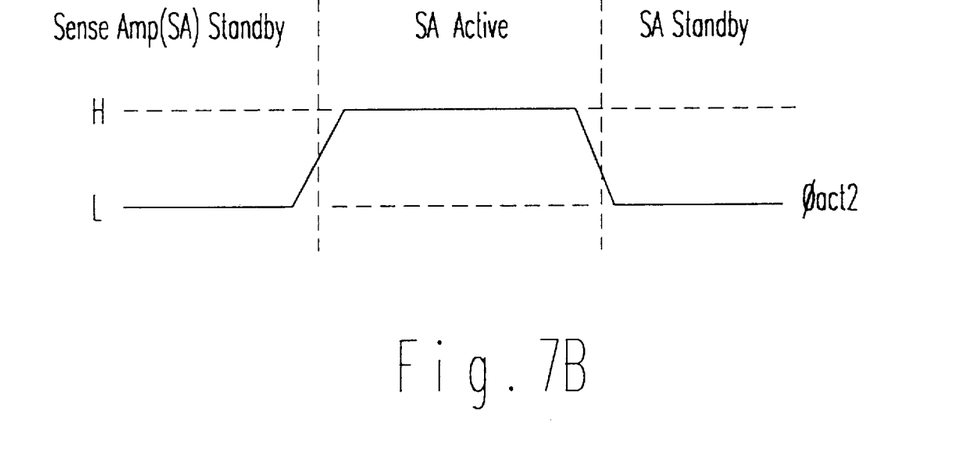
FIG. 7B is a timing diagram of a control signal in FIG. 7A.

FIG. 7A is a circuit diagram of NMOS transistors for driving the sense amplifiers in the semiconductor memory device in accordance with the present invention and FIG. 7B is a timing diagram of a fourth control signal $\phi_{act2}$ in FIG. 7A. As shown in FIG. 7B, the fourth control signal $\phi_{act2}$ is low ("0") in logic in the standby mode and high ("1") in logic in the active mode. In the standby mode, a first NMOS transistor $M_{PW1}$ is turned off in response to the fourth control signal $\phi_{act2}$ and a second NMOS transistor $M_{PW2}$ is turned on in response to an output signal from an inverter 71 which inverts the fourth control signal $\phi_{act2}$, thereby causing a p-well voltage $V_{PW}$ to NMOS transistors in the sense amplifiers to have the ground voltage level Vss. As a result, a threshold voltage $V_T$ of the NMOS transistors in the sense amplifiers is raised due to the body effect, resulting in a reduction in the subthreshold current.

On the other hand, in the case where the present mode is changed from the standby mode to the active mode, the second NMOS transistor $M_{PW2}$ is turned off in response to the output signal from the inverter 71 and the first NMOS transistor $M_{PW1}$ is turned on in response to the fourth control signal $\phi_{act2}$. As the first NMOS transistor $M_{PW1}$ is turned on, a p-well bias node is connected to the second internal voltage generator 23. The second internal voltage Vint2 on the power line of the second internal voltage generator 23 is temporarily lowered due to the charge sharing resulting from a voltage difference between a p-well capacitor and a capacitor of the second internal voltage generator 23. As a result, the NMOS transistors in the sense amplifiers are excessively driven in response to the lowered second internal voltage Vint2. In other words, in the sense amplification operation, the second internal voltage Vint2 on the power line of the second internal voltage generator 23 is temporarily lowered due to a negative charge stored in the p-well capacitor, thereby allowing the sense amplifiers to be operated at high speed. Further, the p-well voltage $V_{PW}$ becomes higher as compared with that in the standby mode. As a result, the threshold voltage $V_T$ of the NMOS transistors in the sense amplifiers is lowered due to a reduction in the body effect and the current drive capability thereof is thus increased. Therefore, the entire circuit can be operated at high speed.

In accordance with the preferred embodiment of the present invention, the first and second internal voltages Vint1 and Vint2 from the first and second internal voltage generators 22 and 23 are used to drive the sense amplifier array and present within the range of Vss≦Vint2≦Vint1≦Vout. Alternatively, the first and second internal voltages Vint1 and Vint2 from the first and second internal voltage generators 22 and 23 may be present within the range of Vss≦Vint1≦Vint2≦Vout. Also, the external supply voltage Vext from the external supply voltage line Vext may be used instead of the first internal voltage Vint1 from the first internal voltage generator 22 or the first and second internal voltages Vint1 and Vint2 from the first and second internal voltage generators 22 and 23 may be the same.

As apparent from the above description, according to the present invention, the reverse bias to the n+p junction between the charge storage plate of the cell capacitor and the substrate is reduced to enhance the cell refresh characteristic. Also, the semiconductor memory device of the present invention requires no negative p-well bias generator. Further, the power lines (first and second internal voltage supply circuits) to the sense amplifier array are separated from the power line (third internal voltage supply circuit) to the peripheral circuit. Therefore, the semiconductor memory device of the present invention can reduce a noise effect on the power line to the peripheral circuit.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:
   a) a plurality of memory cells, each of said plurality of memory cells including:
      1) a capacitor for storing data; and
      2) transistor means for inputting a ground voltage at its substrate and for selectively connecting said capacitor to a bit line;
   b) a plurality of sense amplifier means, connected to corresponding bit lines, for sensing and amplifying data which are transferred from said memory cells to said bit line;
   c) first internal voltage supply means for supplying a stable first internal voltage regardless of a voltage bias state of the memory device, wherein said first internal voltage supply means includes:
      1) an internal voltage generator means for generating the first internal voltage in response to an external high supply voltage and the ground voltage; and
      2) an internal voltage drive means for supplying the first internal voltage from said first internal voltage generator to said sense amplifier means;
   d) first switching means for switching the first internal voltage from said first internal voltage supply means to said sense amplifier means;
   e) second internal voltage supply means for supplying a stable second internal voltage regardless of the voltage bias state of the memory device, wherein said second internal voltage supply means includes:
      1) an internal voltage generator means for generating the second internal voltage in response to an external high supply voltage and the ground voltage; and
      2) an internal voltage drive means for supplying the second internal voltage from said second internal voltage generator to said sense amplifier means;
   f) second switching means for switching the second internal voltage from said second internal voltage supply means to said sense amplifier means; and
   g) a precharge circuit, connected directly between said first switching means and second switching means, and connected between the first internal voltage supply means and the second internal voltage supply means, for precharging said sense amplifier means to a predetermined voltage.

2. A semiconductor memory device as set forth in claim 1, wherein:
   an external high supply voltage is used instead of the first internal voltage supply to generate the first internal voltage.

3. A semiconductor memory device as set forth in claim 1, wherein:
   the first internal voltage from said first internal voltage supply means is lower than an external high supply voltage and higher than the second internal voltage from said second internal voltage supply means, and
   the second internal voltage from said second internal voltage supply means is higher than the ground voltage.

4. A semiconductor memory device as set forth in claim 1, wherein:
   said first switching means includes a PMOS transistor driven in response to a first control signal: and
   said second switching means includes an NMOS transistor driven in response to a second control signal.

5. A semiconductor memory device as set forth in claim 4, further comprising:
   a first inverter for applying the first control signal to control a gate of said PMOS transistor in response to an external high supply voltage and the ground voltage; and
   a second inverter for applying the second control signal to control a gate of said NMOS transistor in response to the external high supply voltage and the ground voltage.

6. A semiconductor memory device as set forth in claim 1, further comprising:
   a first PMOS transistor turned on in a standby mode and off in an active mode; and
   a second PMOS transistor turned off in said standby mode and turned on in said active mode;
   wherein said first PMOS transistor and said second PMOS transistor cooperate to allow an n-well voltage to PMOS transistors in said sense amplifier means to have an external supply voltage level in said standby mode and said first internal voltage level in said active mode.

7. A semiconductor memory device as set forth in claim 6, further comprising:
   a first NMOS transistor turned off in said standby mode and turned on in said active mode; and
   a second NMOS transistor turned on in said standby mode and turned off in said active mode;
   wherein said first NMOS transistor and said second NMOS transistor cooperate to allow a p-well voltage to NMOS transistors in said sense amplifier means to have a ground voltage level in said standby mode and said second internal voltage level in said active mode.

* * * * *